United States Patent
Ko et al.

(10) Patent No.: US 7,413,920 B2
(45) Date of Patent: Aug. 19, 2008

(54) DOUBLE-SIDED ETCHING METHOD USING EMBEDDED ALIGNMENT MARK

(75) Inventors: Young-chul Ko, Yongin-si (KR); Hyun-ku Jeong, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 147 days.

(21) Appl. No.: 11/528,619

(22) Filed: Sep. 28, 2006

(65) Prior Publication Data

US 2007/0128824 A1    Jun. 7, 2007

(30) Foreign Application Priority Data

Dec. 1, 2005    (KR) .................. 10-2005-0116636

(51) Int. Cl.
*H01L 21/00*    (2006.01)
(52) U.S. Cl. ................... 438/50; 438/51; 438/52; 438/53; 438/54; 257/619
(58) Field of Classification Search .............. None
See application file for complete search history.

(56) References Cited

U.S. PATENT DOCUMENTS

| | | | | |
|---|---|---|---|---|
| 6,020,215 | A | * | 2/2000 | Yagi et al. .................. 438/52 |
| 2006/0057755 | A1 | * | 3/2006 | Weber .......................... 438/48 |
| 2006/0205106 | A1 | * | 9/2006 | Fukuda et al. ............... 438/52 |
| 2007/0128757 | A1 | * | 6/2007 | Ko et al. ....................... 438/50 |

FOREIGN PATENT DOCUMENTS

KR    10-2006-0034790 A    4/2006

* cited by examiner

*Primary Examiner*—Duy-Vu N Deo
(74) *Attorney, Agent, or Firm*—Sughrue Mion, PLLC

(57) ABSTRACT

A double-sided etching method using an embedded alignment mark includes: preparing a substrate having first and second alignment marks embedded in an intermediate portion thereof; etching an upper portion of the substrate so as to expose the first alignment mark from a first surface of the substrate; etching the upper portion of the substrate using the exposed first alignment mark; etching a lower portion of the substrate so as to expose the second alignment mark from a second surface of the substrate; and etching the lower portion of the substrate using the exposed second alignment mark.

7 Claims, 5 Drawing Sheets

DOUBLE-SIDED ETCHING METHOD USING EMBEDDED ALIGNMENT MARK

CROSS-REFERENCE TO RELATED PATENT APPLICATIONS

This application claims priority from Korean Patent Application No. 10-2005-0116636, filed on Dec. 1, 2005, in the Korean Intellectual Property Office, the disclosure of which is incorporated herein in its entirety by reference.

BACKGROUND OF THE INVENTION

1. Field of the Invention

Methods consistent with the present invention relate to a method of manufacturing a Micro Electro-Mechanical Systems (MEMS) structure and, more particularly, to a method of double-sided etching using an embedded alignment mark.

2. Description of the Related Art

When manufacturing a MEMS structure such as an optical scanner for a flat panel display, double-side etching may be required. Thus, corresponding alignment marks are required for etching first and second surfaces. However, the formation of alignment marks on the two surfaces causes a large alignment error, which results in a misalignment between comb electrodes in the MEMS structure, thus causing a failure of the MEMS device.

Therefore, to reduce an alignment error in double-sided etching, there is a need for a technique for using alignment marks only on one surface.

SUMMARY OF THE INVENTION

The present invention provides a double-sided etching method using a new embedded alignment mark that can reduce an alignment error in a Micro Electro-Mechanical Systems (MEMS) structure.

According to an aspect of the present invention, there is provided a double-sided etching method using an embedded alignment mark, the method including: preparing a substrate having first and second alignment marks embedded in an intermediate portion thereof; etching an upper portion of the substrate so as to expose the first alignment mark from a first surface of the substrate; etching the upper portion of the substrate using the exposed first alignment mark; etching a lower portion of the substrate so as to expose the second alignment mark from a second surface of the substrate; and etching the lower portion of the substrate using the exposed second alignment mark.

The substrate may include a first substrate forming the upper portion, a second substrate forming the lower portion, and an insulating layer disposed between the first and second substrates. The first and second alignment marks may be formed in the insulating layer using etching. The preparing of the substrate may include: preparing the first substrate; forming the insulating layer on the first substrate; etching the insulating layer to form the first and second alignment marks; and bonding the second substrate onto the insulating layer.

The preparing of the substrate may further include: forming marks at positions on a side of the first substrate opposing the insulating layer to correspond to positions of the first and second alignment marks; and forming a mark at a position on a side of the second substrate opposing the insulating layer to correspond to the position of the second alignment mark.

In order to etch the upper portion of the substrate, the first substrate may be etched using the mark at the position on the first substrate corresponding to the position of the first alignment mark. Furthermore, to etch the lower portion of the substrate, the second substrate may be etched using the mark at the position on the second substrate corresponding to the position of the second alignment mark.

BRIEF DESCRIPTION OF THE DRAWINGS

The above and other features and advantages of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
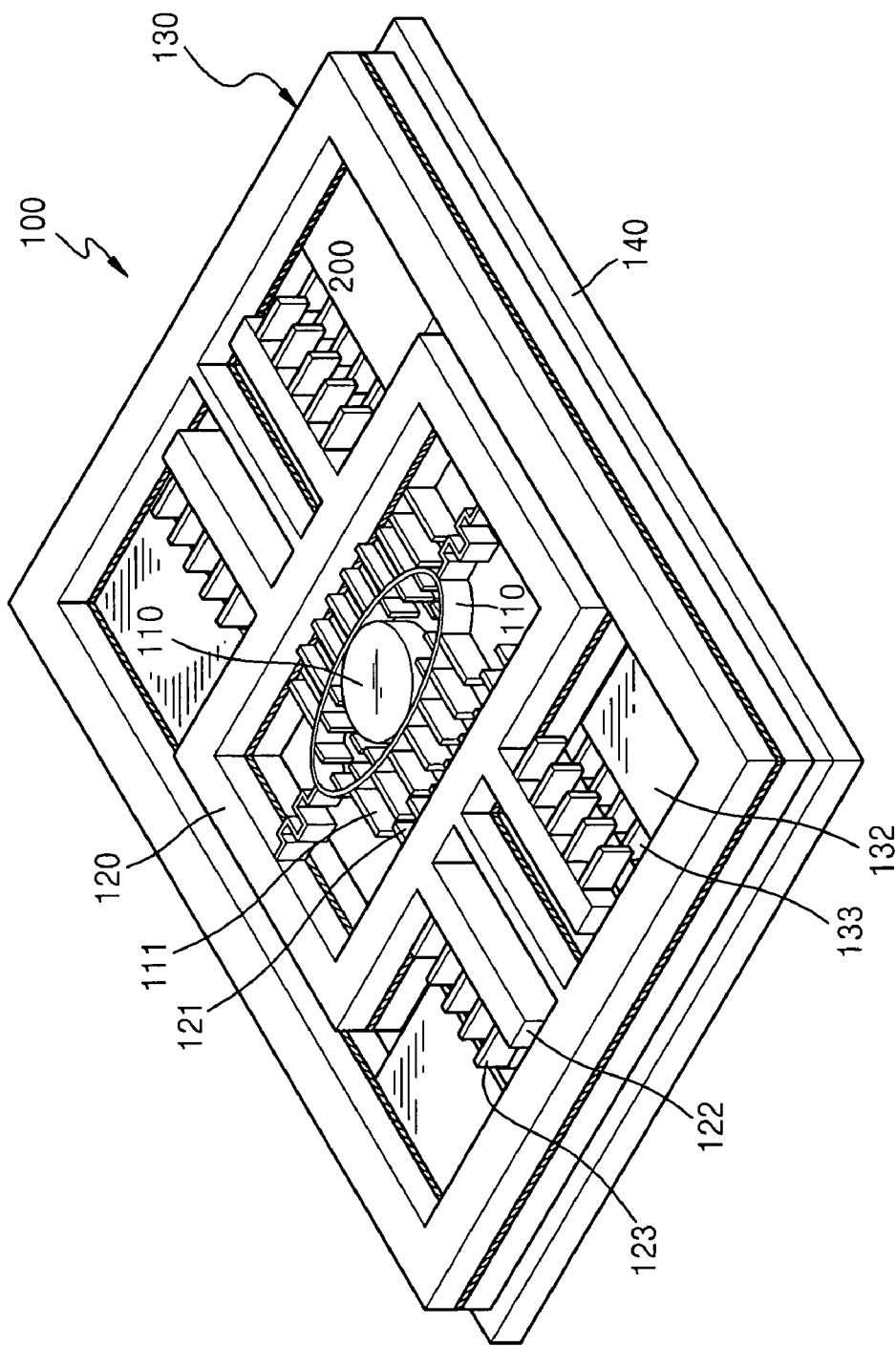
FIG. 1 is a perspective view of a related art optical scanner disclosed in the Korean Patent Application No. 2004-83537.

A double-sided etching method using an embedded alignment mark according to an exemplary embodiment of the present invention will now be described with reference to the accompanying drawings. In the drawings, some elements may be exaggerated for clarity or omitted to avoid complexity and to aid in the understanding of the present invention. This is not intended to limit the technical scope of the present invention.

FIG. 1 is a perspective view of an optical scanner 100 disclosed in Korean Patent Application No. 2004-83537.

Referring to FIG. 1, the optical scanner 100 is actuated in two directions by first movable comb electrodes 111 and first stationary comb electrodes 121, which are disposed between a stage 110 and a movable frame 120, and second movable comb electrodes 123 and second stationary comb electrodes 133, which are disposed between a first member 122 extending from the movable frame 120 and a second member 132 extending from a stationary frame 130. The first and second stationary comb electrodes 121 and 133 are perpendicular to a base substrate 140. The first and second movable comb electrodes 111 and 123 are separated from the base substrate 140 to correspond to the first and second stationary comb electrodes 121 and 133 in order to rotate.

Figure 2:
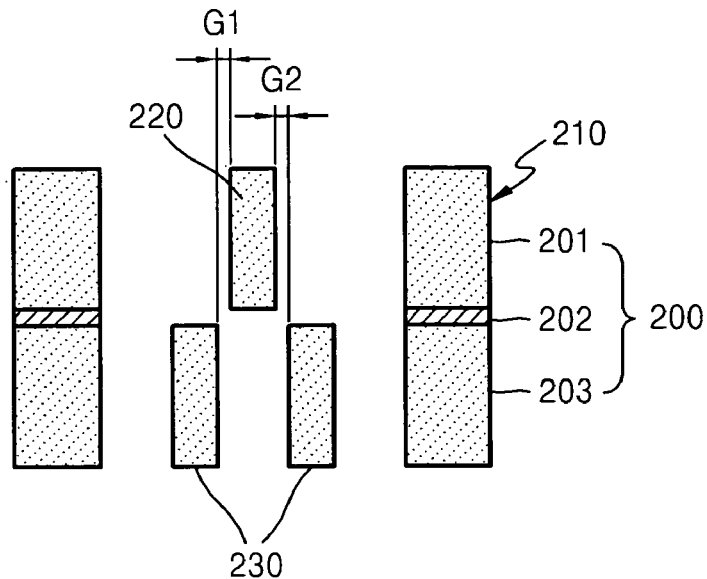
FIG. 2 is a schematic cross-sectional view of comb electrodes.

FIG. 2 is a schematic cross-sectional view of comb electrodes shown in FIG. 1. Referring to FIG. 2, a frame 210 is formed by etching a silicon-on-insulator (SOI) substrate 200 including a first silicon layer 201, an insulating layer 202, and a second silicon layer 203. The frame 210 may correspond to the movable frame 120 and the stationary frame 130 shown in FIG. 1. A movable comb electrode 220 formed from the first silicon layer 201 is arranged in a staggered fashion relative to a stationary comb electrode 230 formed from the second silicon layer 203. It is important to make distances G1 and G2 between the movable comb electrode 220 and the stationary comb electrode 230 equal. When an error in the distances G1 and G2 occurs, the stage 110 (FIG. 1) may not rotate normally. In order to make the distances G1 and G2 equal, it is necessary to reduce an error during patterning of the first and second silicon layers 201 and 203 using an alignment mark.

Figure 3A:
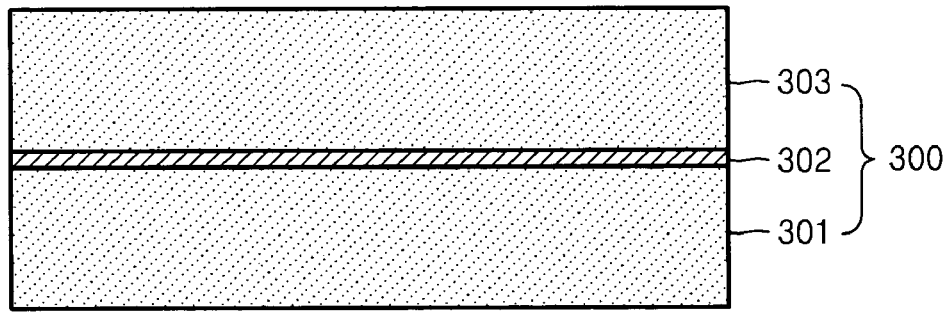
FIGS. 3A-3C are cross-sectional views illustrating steps of a method of manufacturing a structure shown in FIG. 2.
Figure 3B:
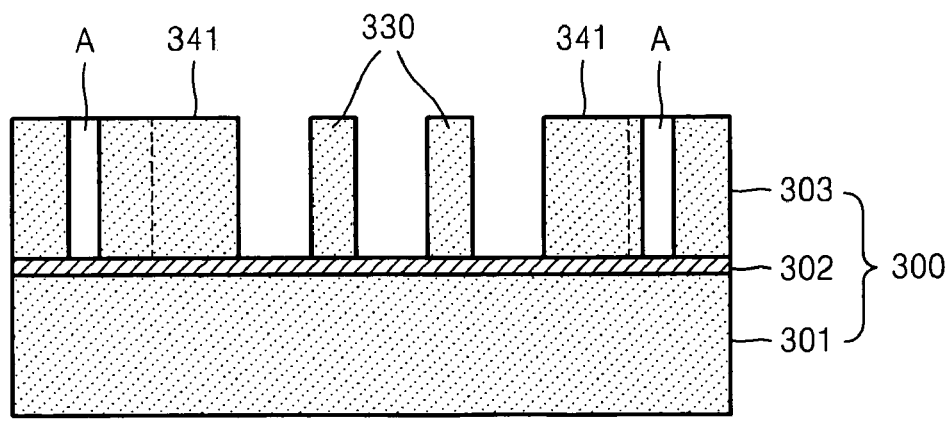
Figure 3C:
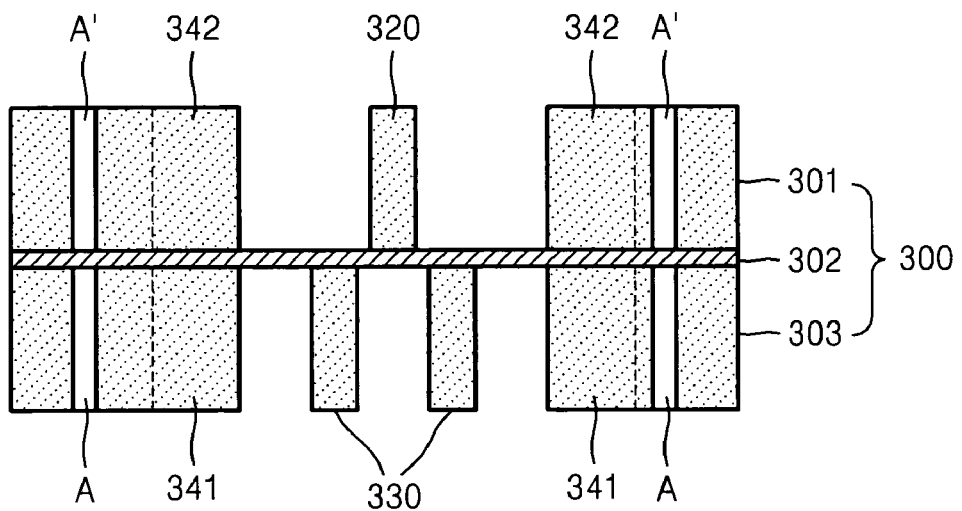

FIGS. 3A-3C are cross-sectional views illustrating steps of a method of manufacturing a structure as shown in FIG. 2

Referring to FIG. 3A, an SOI substrate 300 in which a first silicon layer 301, an insulating layer 302, and a second silicon layer 303 have been sequentially formed is prepared. Referring to FIG. 3B, the second silicon layer 303 is patterned to form stationary comb electrodes 330, a portion 341 of a frame, and an alignment mark A. The alignment mark A is formed by etching a portion of the second silicon layer 303 and the portion of the second silicon layer 303 containing the alignment mark A is removed from a complete structure.

Referring to FIG. 3C, with the first silicon layer 301 of the SOI substrate 300 is directed upward, the first silicon layer 301 is patterned using the alignment mark A to form a movable comb electrode 320 and the remaining portion 342 of the frame. In this case, an alignment mark A' may also be formed in the first silicon layer 301 and used to pattern a structure during subsequent etching.

Subsequently, an exposed portion of the insulating layer 302 is selectively etched and the portions of the first and second silicon layers 301 and 302 containing the alignment marks A' and A are scribed to form the structure shown in FIG. 2.

According to the manufacturing process illustrated in FIGS. 3A-3C, an alignment error may significantly increase when the first silicon layer 301 is patterned using a microscope while observing the alignment mark A formed in the second silicon layer 303 with another microscope.

FIGS. 4A-4F are cross-sectional views illustrating steps of a double-sided etching method using an embedded alignment mark according to an exemplary embodiment of the present invention.

Figure 4A:
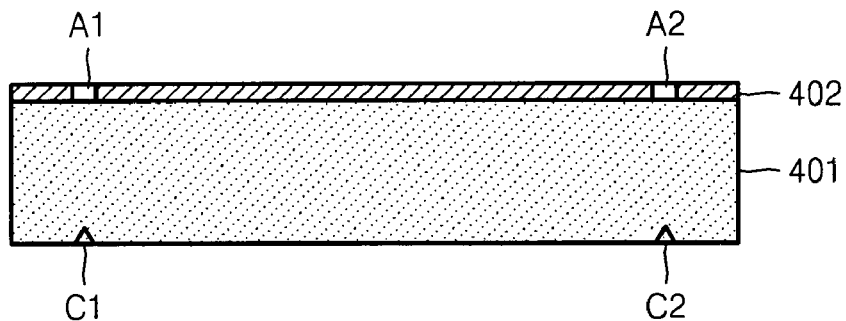
FIGS. 4A-4F are cross-sectional views illustrating steps of a double-sided etching method of using an embedded alignment mark according to an exemplary embodiment of the present invention.

Referring to FIG. 4A, an insulating layer 402 is deposited on a first silicon substrate 401 having a thickness of 500 µm. The insulating layer 402 may be a 2 µm thick silicon oxide layer.

Subsequently, the insulating layer 402 is patterned to form first and second alignment marks A1 and A2 in the insulating layer 402. The first and second alignment marks A1 and A2 are used to align the first and second substrates 401 and 403, respectively. The alignment marks A1 and A2 are formed by etching the insulating layer 402. In this case, marks C1 and C2 are chipped in a side of the first substrate 401 opposing the insulating layer 402 in which the first and second alignment marks A1 and A2 have been formed. Reference characters C1 and C2 denote chipped portions in the first substrate 401.

Figure 4B:
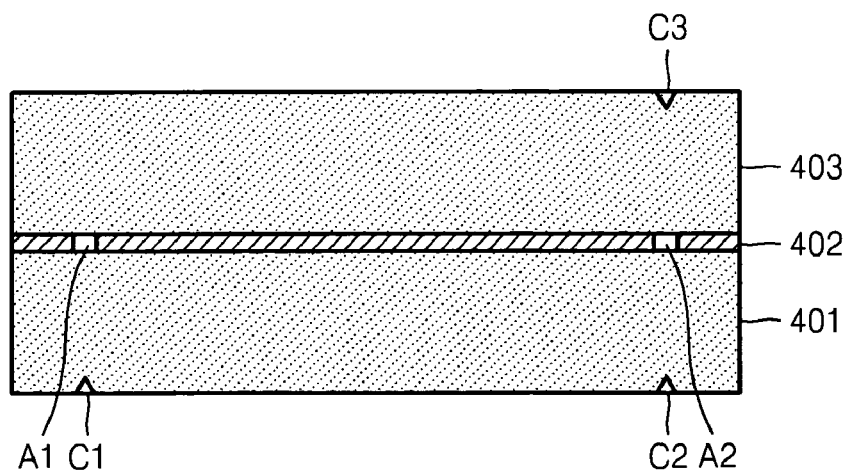

Referring to FIG. 4B, a second silicon substrate 403 having a thickness of 500 µm is bonded onto the insulating layer 402. Subsequently, the position of the second alignment mark A2 is marked on a surface of the second substrate 403 opposing the second alignment mark A2. For example, a chipped portion C3 is created at a position of the second substrate 403 corresponding to the position of the chipped portion C2. The first substrate 401, the insulating layer 402, and the second substrate 403 cooperate to form an SOI substrate.

Figure 4C:
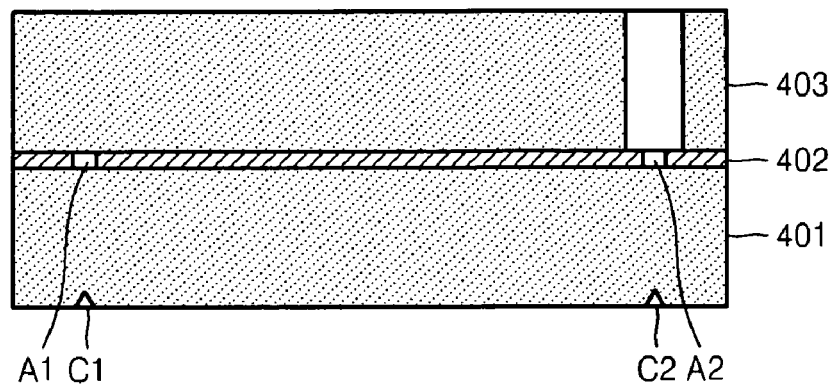
Figure 4D:
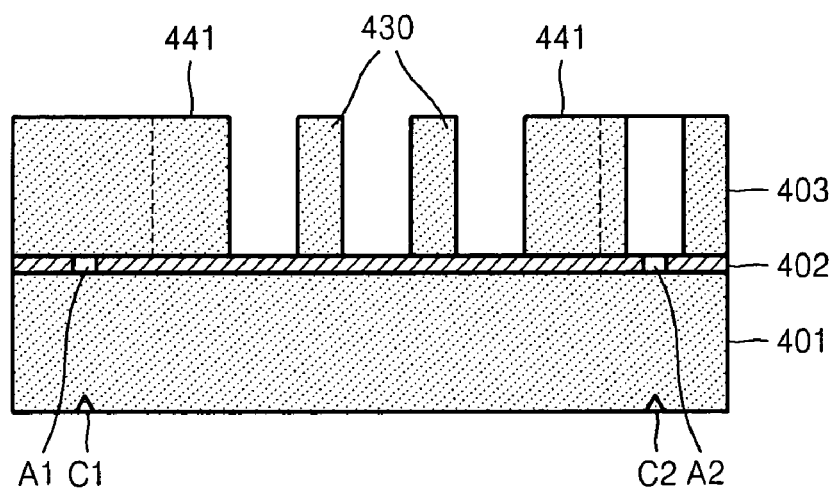
Figure 4E:
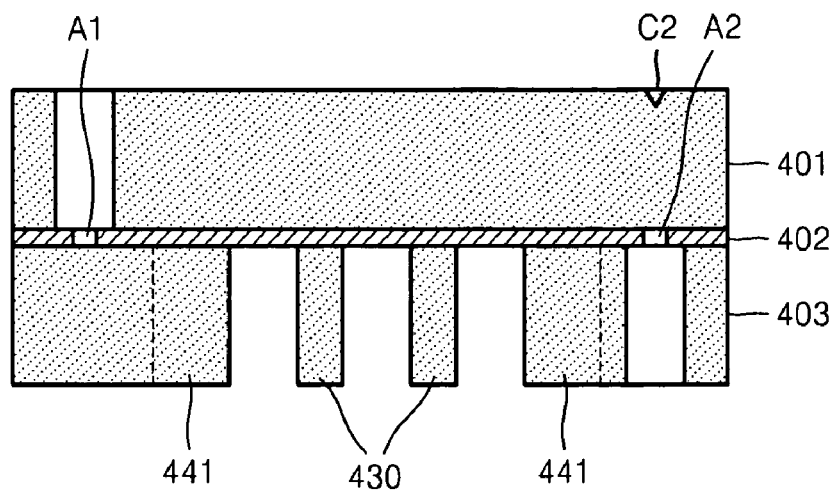
Figure 4F:
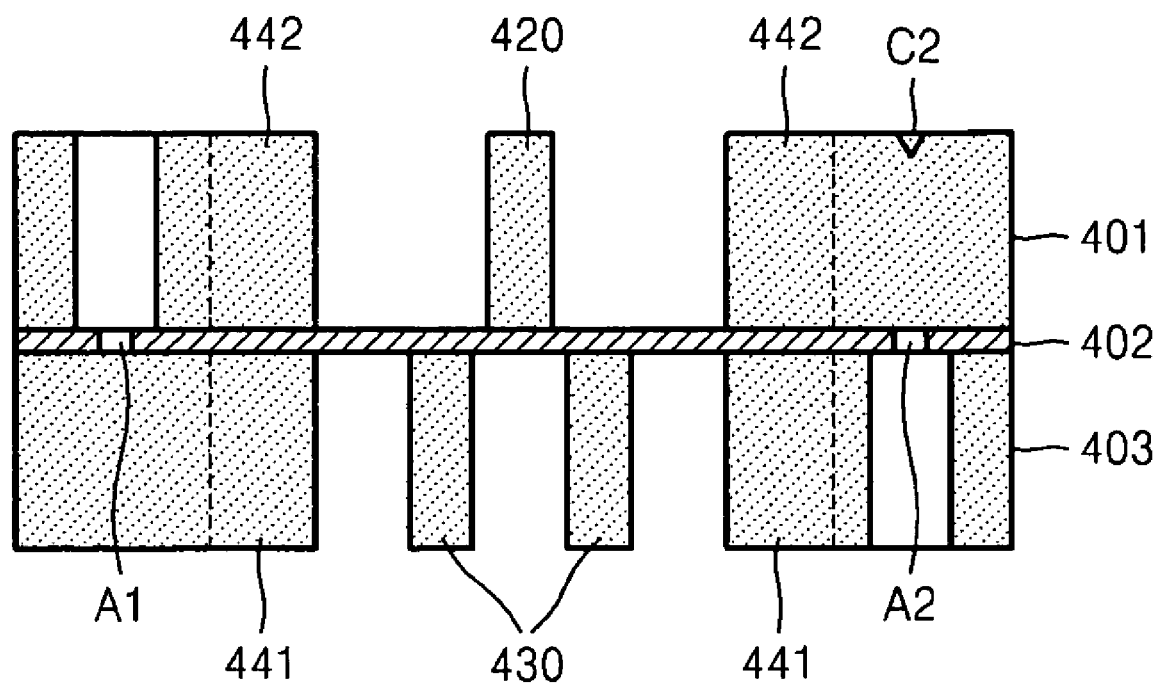

Referring to FIG. 4C, a portion of the second substrate 403 surrounding the chipped portion C3 is etched to expose the second alignment mark A2. Referring to FIG. 4D, the second substrate 403 is patterned using the second alignment mark A2 to form a stationary comb electrode 430 and a portion 441 of a frame. Referring to FIG. 4E, with the first substrate 401 being directed upwardly, a portion of the first substrate 401 surrounding the chipped portion C1 is etched to expose the first alignment mark A1. Referring to FIG. 4F, the first substrate 401 is patterned using the first alignment mark A1 to form a movable comb electrode 420 and the remaining portion 442 of the frame. Subsequently, an exposed portion of the insulating layer 402 is selectively etched and portions of the insulating layer 402 containing the alignment marks A' and A are scribed to form a structure as shown in FIG. 2.

The manufacturing method of FIGS. 4A-4E consistent with the present invention patterns upper and lower structures using alignment marks formed by one pattering step in an insulating layer, thus reducing an alignment error between the upper and lower structures.

The double-sided etching method using an embedded alignment mark can reduce an alignment error in a Micro Electro-Mechanical Systems (MEMS) structure comprising upper and lower structures, thus allowing precise formation of a gap between comb electrodes. This etching method can be usefully utilized in precisely fabricating upper and lower structures in a MEMS structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A double-sided etching method using an embedded alignment mark, the method comprising:
   preparing a substrate having first and second alignment marks embedded in an intermediate portion thereof;
   etching an upper portion of the substrate so as to expose the first alignment mark from a first surface of the substrate;
   etching the upper portion of the substrate using the exposed first alignment mark;
   etching a lower portion of the substrate so as to expose the second alignment mark from a second surface of the substrate; and
   etching the lower portion of the substrate using the exposed second alignment mark.

2. The method of claim 1, wherein the substrate comprises a first substrate forming the upper portion, a second substrate forming the lower portion, and an insulating layer disposed between the first and second substrates.

3. The method of claim 2, wherein the first and second alignment marks are formed in the insulating layer using etching.

4. The method of claim 2, wherein the preparing of the substrate comprises:
   preparing the first substrate;
   forming the insulating layer on the first substrate;
   etching the insulating layer to form the first and second alignment marks; and
   bonding the second substrate onto the insulating layer.

5. The method of claim 4, wherein the preparing of the substrate further comprises:
   forming marks at positions on a side of the first substrate opposing the insulating layer to correspond to positions of the first and second alignment marks; and
   forming a mark at a position on a side of the second substrate opposing the insulating layer to correspond to the position of the second alignment mark.

6. The method of claim 5, wherein in the etching of the upper portion of the substrate, the first substrate is etched using the mark at the position on the first substrate corresponding to the position of the first alignment mark.

7. The method of claim 5, wherein in the etching of the lower portion of the substrate, the second substrate is etched using the mark at the position on the second substrate corresponding to the position of the second alignment mark.

* * * * *